United States Patent
Plants et al.

(10) Patent No.: US 8,067,959 B2
(45) Date of Patent: Nov. 29, 2011

(54) PROGRAMMABLE DELAY LINE COMPENSATED FOR PROCESS, VOLTAGE, AND TEMPERATURE

(75) Inventors: William C. Plants, Campbell, CA (US); Suhail Zain, San Ramon, CA (US); Joel Landry, Colorado Springs, CO (US); Gregory W. Bakker, San Jose, CA (US); Tomek P. Jasinoski, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/716,469

(22) Filed: Mar. 3, 2010

(65) Prior Publication Data
US 2010/0156459 A1 Jun. 24, 2010

Related U.S. Application Data

(62) Division of application No. 12/175,399, filed on Jul. 17, 2008, now Pat. No. 7,701,246.

(51) Int. Cl.
H03K 19/173 (2006.01)
H03K 25/00 (2006.01)
(52) U.S. Cl. .............. 326/37; 326/41; 326/47; 326/101
(58) Field of Classification Search .............. 326/37–41, 326/47, 101
See application file for complete search history.

(56) References Cited

U.S. PATENT DOCUMENTS

| | | | |
|---|---|---|---|
| 6,567,490 B1 | 5/2003 | Hayashi et al. | |
| 6,819,157 B2 * | 11/2004 | Cao et al. | 327/262 |
| 6,914,492 B2 * | 7/2005 | Hui et al. | 331/57 |
| 7,009,433 B2 * | 3/2006 | Zhang et al. | 327/158 |
| 7,161,402 B1 | 1/2007 | Sompur et al. | |
| 7,391,246 B1 | 6/2008 | Lu | |
| 7,701,246 B1 | 4/2010 | Plants et al. | |
| 2003/0001634 A1 * | 1/2003 | Cao et al. | 327/158 |
| 2003/0001650 A1 * | 1/2003 | Cao et al. | 327/277 |
| 2004/0239387 A1 * | 12/2004 | Zhang et al. | 327/158 |
| 2005/0140416 A1 | 6/2005 | Rashid | |
| 2006/0250160 A1 * | 11/2006 | Chang et al. | 326/93 |
| 2008/0123445 A1 | 5/2008 | Vergnes et al. | |
| 2008/0298476 A1 * | 12/2008 | Bereza et al. | 375/257 |

\* cited by examiner

*Primary Examiner* — Shawki Ismail
*Assistant Examiner* — Thienvu Tran
(74) *Attorney, Agent, or Firm* — Lewis and Roca LLP

(57) ABSTRACT

A delay line compensated for process, voltage, and temperature variations, includes a delay locked loop (DLL) configured to delay a digital signal by the clock period of the digital signal, the DLL including a DLL delay line arranged as a plurality of cascaded sub-delay lines each sub-delay line providing one of a plurality of delay quanta in response to a digital control signal. A fractionating circuit is configured to generate a digital delay line control signal that is a fraction of the digital control signal. A digital delay line is arranged as a plurality of cascaded sub-delay lines each sub-delay line providing one of a plurality of delay quanta in response to the digital delay line control signal.

13 Claims, 13 Drawing Sheets

PROGRAMMABLE DELAY LINE COMPENSATED FOR PROCESS, VOLTAGE, AND TEMPERATURE

CROSS-REFERENCE TO RELATED APPLICATIONS

This application is a divisional of co-pending U.S. patent application Ser. No. 12/175,399, filed Jul. 17, 2008, the entirety of which is incorporated by reference herein.

BACKGROUND OF THE INVENTION

1. Field of the Invention

The present invention relates to integrated circuit technology. More particularly, the present invention relates to programmable delay lines compensated for process, voltage, and temperature (PVT).

2. The Prior Art

Non-PVT compensated programmable delays are known in the art. Their use frequently results in delays that are not predictable and are thus often quite different from the ideally desired value.

PVT compensated programmable delay lines are also known in the art like, for example, U.S. Pat. No. 6,958,634 (the '634 patent) issued to Rashid. The '634 patent teaches a master analog delay-locked loop (DLL) establishing a coarse time delay unit governed by analog signals generated from a phase discriminator/charge pump/bias generator arrangement. The analog signals are then used to control a slave delay line comprised of the coarse time delay units. Multiplexers select outputs from adjacent coarse time delay units and present them to a phase interpolator to generate a fine time delay which will be equal to or in between the selected adjacent coarse time delays.

The master/slave DLL taught in the '634 patent has a number of drawbacks. First, like many analog circuits it can be harder to design and be more susceptible to noise than the equivalent digital function. Phase interpolators with good linearity characteristics can be particularly difficult to design. Second, the size of the coarse time delay unit is fixed. The '634 patent teaches using different numbers of coarse time delay units in different embodiments in applications requiring different degrees of time resolution, but a considerable degree of flexibility is lost by limiting the programmable control functionality exclusively to the slave delay line. Thirdly, by doing the critical operations in analog format, conversion back to digital signal levels can be required as shown by the box labeled CM in the various '634 figures. This introduces a non-PVT compensated delay term into the output delay that may be significant in some applications.

Another example of a PVT compensated programmable delay line of the prior art is U.S. Pat. No. 7,161,402 (the '402 patent) issued to Sompur et al. The '402 patent teaches a fairly standard double data rate memory (DDR) 90° data strobe phase shift circuit comprising a master/slave DLL with a one quarter (of the master delay) length slave delay line with the point of novelty being an optionally inserted "half-bit delay" in the slave delay line used to increase the resolution of the data strobe timing. In the embodiment shown in FIG. 6 of the '402 patent, a digital block 610 is inserted between the master DLL and the slave delay line to provide a programmable percentage adjustment to the slave delay line.

The master/slave DLL of the '402 patent is very application specific and the programmable aspect is limited to a tweak of the basic 90° phase shift that such DDR data strobe delay circuits typically provide. Like the master/slave DLL of the '634 patent, no programmable control of the master DLL is present.

Field programmable gate arrays (FPGAs) are a part of a larger class of integrated circuits known as programmable logic devices (PLDs) known in the art. FPGAs are known for their ability to implement end user specified logic functions by means of programming originally uncommitted logic and routing resources. FPGAs also have a variety of programmable clock resources available. While multiple output phase (multi-phase) phase-locked loops (PLLs) and multi-phase DLLs are present on many FPGAs for clock applications, no general purpose PVT compensated programmable delay line suitable for use with both clocks and other signals has been previously disclosed.

An end user's FPGA design is typically implemented by use of a computer program product (also known as software or, more specifically, design software) produced by the FPGA manufacturer and distributed by means of a computer-readable medium such as providing a CD-ROM to the end user or making the design software downloadable over the internet. Typically the manufacturer supplies a library of design elements as part of the computer program product. The library design elements provide a layer of insulation between the end user and the circuit details of the FPGA features (like, for example, logic modules, memory blocks and programmable delay lines) available to the end user. This makes the design software easier to use for the end user and simplifies the manufacturer's task of processing the end user's complete design by the various tools in the design software.

When persons skilled in the art speak of process, voltage and temperature compensation, it is generally understood that process is compensated for in a different manner than voltage and temperature. Typically, processing refers to the characteristics of the physical integrated circuit when fully fabricated which are typically constant or nearly so (or vary within a specified lifetime drift for certain components) for the life of the part, while voltage and temperature are operating conditions that occur at any given moment when the integrated circuit is functioning. Thus process compensation typically occurs in the design phase prior to fabrication, while the circuitry doing the voltage and temperature compensation typically responds actively to changes in voltage and temperature in an ongoing manner as the part functions.

BRIEF DESCRIPTION OF THE INVENTION

A PVT-compensated delay element has a selectable amount of delay. According to one application, the delay element is placed in series with either the reference or feedback input to a phase-locked loop (PLL) to allow predictable time shifting of the PLL output by the selected amount of delay. Alternate uses are possible.

A clock delay line compensated for process, voltage, and temperature variations, includes a delay locked loop (DLL) configured to delay a clock signal by the clock period of the clock signal, the DLL including a DLL delay line arranged as a plurality of cascaded sub-delay lines each sub-delay line providing one of a plurality of delay quanta in response to a digital control signal. A fractionating circuit is configured to generate a clock delay line control signal that is a fraction of the digital control signal. A clock delay line delay line is arranged as a plurality of cascaded sub-delay lines each sub-delay line providing one of a plurality of delay quanta in response to the clock delay line control signal.

A multiplexer allows selection of a different number of phases as appropriate for an individual application (N in the diagrams). This allows a division of a known (and by definition PVT compensated) delay of the reference clock period ($T_{per}$) to produce a smaller PVT compensated known delay ($T_{per}/N$). The masking logic allows a multiplication of this small known delay by a factor M producing a known PVT compensated delay ($T_{per}*(M/N)$) in the PLL input delay line. The DLL can be used for general purpose clock retiming if the PVT delay line is not needed. Other delay lines distributed around the chip can be controlled by the DLL. These delay lines do not necessarily need to be as long as the delay line in the DLL. A digital multiplier can be used to do the arithmetic in an alternate embodiment. Provision can be made to alter the selected PVT delay value dynamically.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Many PLL features (like input/output dividers) and FPGA features (like programmable connections to/from these blocks) known to persons of ordinary skill in the art have been omitted for the sake of simplicity and clarity of presentation.

Figure 1:
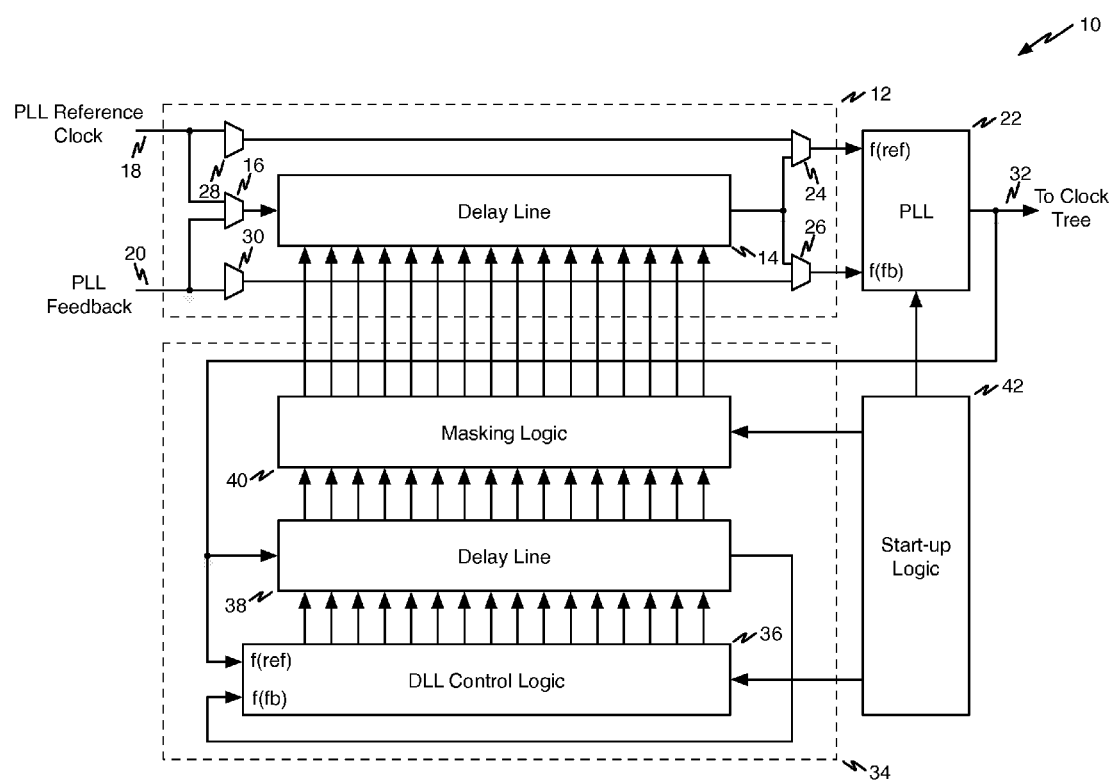
FIG. 1 is a block diagram of an illustrative compensated delay line according to the present invention.

Referring first to FIG. 1, a block diagram shows an illustrative delay line 10 compensated for process, voltage, and temperature according to the present invention. A PVT-compensated delay line 12 includes a delay line 14. The input to delay line 14 is driven by multiplexer 16 that selectively provides the PLL reference clock on line 18 or the PLL feedback on line 20 to the delay line input.

The output of delay line 14 is provided to phase-locked loop (PLL) 22 through multiplexers 24 and 26. Multiplexer 24 selectively provides either the output of delay line 14 or the PLL reference clock signal from line 18 to the f(ref) input of PLL 22. Multiplexer 26 selectively provides either the output of delay line 14 or the PLL feedback signal from line 20 to the f(fb) input of PLL 22. Multiplexers 28 and 30 that provide the PLL reference clock signal and PLL feedback signal to multiplexers 24 and 26 are shown having only one input and are present to provide path delays that match the delay of the PVT delay line multiplexer 16. The output of PLL 22 drives the trunk of the clock tree of the integrated circuit from line 32. The feedback line 20 is sampled from a convenient branch of the clock tree or in some applications driven from line 32 by means of multiplexers not shown.

Delay line 10 also includes delay locked loop 34. DLL 34 includes DLL control logic 36, delay line 38, and masking logic 40. The PLL 22 and DLL 34 are controlled by startup logic 42. The DLL control logic includes a phase discriminator having f(ref) and f(fb) inputs to allow synchronization of the delay with the PLL output signal on line 32.

The two delay lines 14 and 38 should ideally be identical (in both design and physical layout), oriented the same way on the die, and preferably placed physically adjacent to one another. Persons of ordinary skill in the art will appreciate that the delay line 14 need not be as long as the delay line 38.

When locked, the DLL delay line is under active control of the DLL control logic 36 which forces the delay through delay line 38 to be exactly equal to the clock period (in this case the output of the PLL).

The DLL delay line is broken into a number of identical sub-delay lines. The number of sub-delay lines used in an application is chosen by the user and the rest are set to the minimum delay (code 0) by the DLL logic. A minimum number of the sub-delay lines will be required to maintain minimum operating frequency placing a lower bound on the number (N) of the sub-delay lines that are selected for use. The sub-delay lines closest to the input of the delay line are used first, moving towards the output end of the cascade chain as more delay is needed.

The number of sub-delay lines chosen (N) divides a known delay (the entire clock period $T_{per}$) into N equal (or nearly equal) smaller periods of length ($T_{per}/N$). Since the DLL provides active control of the number of delay elements necessary to maintain lock (i.e., the number of quanta changes dynamically with PVT), these delays are all PVT compensated.

The masking logic allows the control bits for a certain number (M) of these delays to be gated to the PVT-compensated delay line while the rest of the control bits are forced to logic-0. This causes the PVT-compensated delay line to have a delay of $(M/N)*T_{per}$.

Persons of ordinary skill in the art will appreciate that the arrangement of FIG. 1 including multiplexers 16 24, and 26 allows operation in a mode wherein the phase of the PLL feedback clock will lead the phase of the PLL reference clock and in a mode wherein the phase of the PLL feedback clock will lag the phase of the PLL reference clock. To operate the delay line in a mode wherein the phase of the PLL feedback clock will lead the phase of the PLL reference clock, multiplexers 16 and 26 are used to place the delay line 14 in series with the f(fb) input of PLL 22, and to operate the delay line in a mode wherein the phase of the PLL feedback clock will lag the phase of the PLL reference clock, multiplexers 16 and 24 are used to place the delay line 14 in series with the f(ref) input of PLL 22. The chosen value of $(M/N)*T_{per}$ determines the amount of lag time or lead time.

Given the interaction between the two active feedback loops (the PLL and the DLL), some care must be taken to insure that the circuit starts up and operates properly. According to one illustrative startup procedure (others are possible), the DLL is disabled and the PVT delay line controls are forced to all-zeros through the masking logic until the PLL acquires lock.

Next, the DLL is released to acquire lock while keeping the PVT delay line disabled. This is done by forcing the delay to zero. Persons skilled in the art will observe that multiplexers 28 and 30 are set to always pass the inputs on lines 18 and 20, respectively and are used as delay matching elements to match the delay of multiplexer 16.

Next, DLL tracking and correction is temporarily disabled while turning on the PVT delay line. In some cases it will be advantageous to do this in multiple steps. For example, one sub-delay line or half of a sub-delay line at a time ("half a sub-delay line" would be turning on bit<3> and then bits<2: 0> in alternating steps). Whatever the step size, the PLL lock signal (not shown in the figure) is monitored to wait for it to reacquire lock, if necessary, before continuing.

The DLL tracking and correction is then re-enabled and the DLL lock signal is monitored to wait for the DLL to reacquire lock, if necessary. The system is then notified that the PLL and PVT delay lines are ready to commence operation. Persons of ordinary skill in the art will appreciate that the presence of or need for this start-up procedure is a function of an individual design and may or may not be necessary in any given case.

Because of the two active (and interactive) feedback loops (the PLL and DLL), care must be taken to make sure there is no instability and to minimize the jitter during operation. Consideration should be given to: performing a frequency domain analysis of the entire system to insure that there are no inconveniently placed poles/zeros, and adjusting the DLL update rate and phase discriminator design appropriately to damp out potential instabilities.

Figure 2:
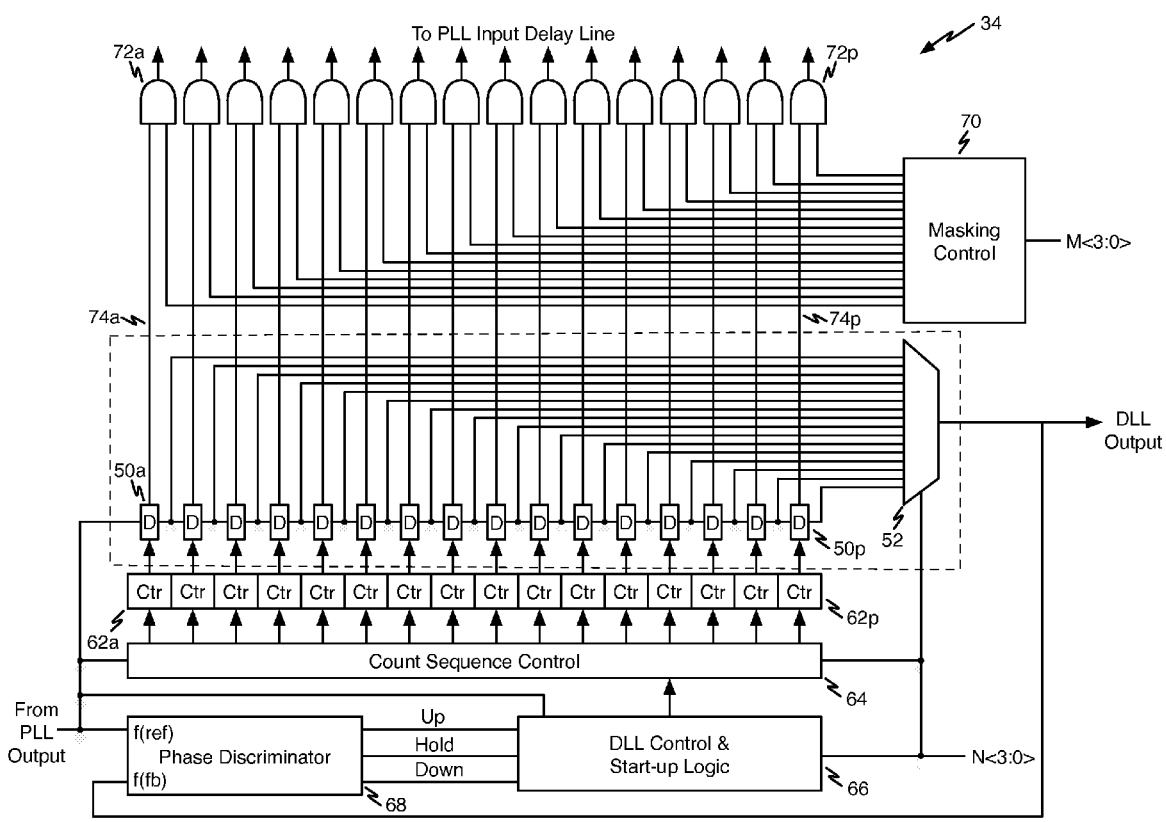
FIG. 2 is a block diagram of an illustrative delay locked loop (DLL) that may be used in the present invention.

FIG. 2 is a more detailed block diagram of an illustrative delay locked loop (DLL) such as DLL 34 of FIG. 1 that may be used in the present invention. Delay line 38 of FIG. 1 includes a plurality of individual sub-delay lines 50a through 50p, arranged in cascade. Sixteen such cascaded sub-delay lines 50a through 50p are shown in FIG. 2, but persons of ordinary skill in the art will appreciate that the present invention encompasses embodiments having other numbers of sub-delay lines 50a through 50p. The input to the first one of the sub-delay lines 50a is fed by the output of the PLL 22 of FIG. 1. The output of each of sub-delay lines 50a through 50p is provided to a separate data input of delay multiplexer 52. The select inputs of delay multiplexer 52 are driven by select signals shown as N<3:0> in FIG. 2. The output of each of sub-delay lines 50a through 50p may be individually selected using delay multiplexer 52.

Figure 3:
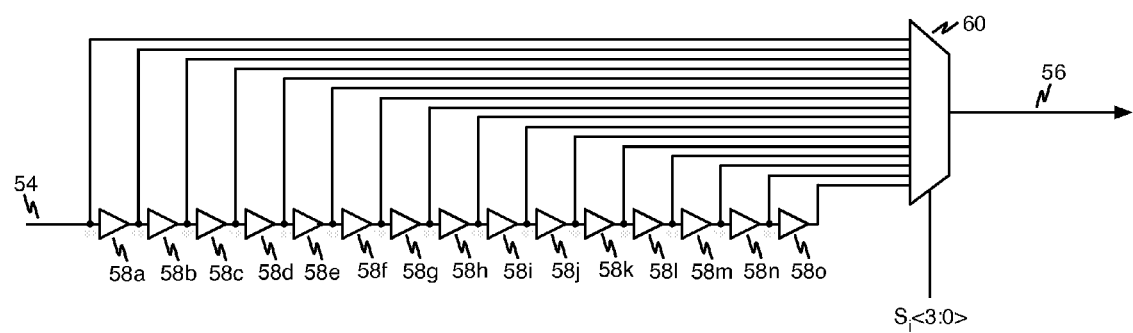
FIG. 3 is a block diagram of an illustrative sub-delay line that may be utilized in the present invention.

Referring now to FIG. 3, a block diagram shows an illustrative configuration of a sub-delay line that may be utilized in the present invention. The sub-delay line includes an input node 54 and an output node 56. A series of buffers 58a through 58o, each having a unit delay, are connected in cascade. While FIG. 3 shows a sub-delay line having fifteen buffers, persons of ordinary skill in the art will appreciate that other numbers of buffers may be provided.

The input node and the output of each of buffers 58a through 58o are supplied to the data inputs of multiplexer 60. The select inputs of multiplexer 60 are driven by a set of inputs. These inputs are shown as inputs $S_i$<3:0> in the case of sixteen data inputs. In the embodiment of FIG. 2, sixteen sub-delay lines having fifteen delay quanta each are shown only as a non-limiting illustration, but this is a design choice that will be made in any particular application based on system frequency and accuracy requirements. The quanta (1 quantum=the minimum time step) and associated multiplexer pick-offs could be implemented in a variety of ways. For example, multiplexer 60 could be built as a discrete circuit as shown in FIG. 3 or it could be broken in to 16 separate transmission gates each located next to its associated buffer 58a through 58o and the input node 54. The key is to carefully craft the quanta, the sub-delay lines, and the entire delay line to minimize the delay through multiplexer 60 and to make sure that all parallel delays are identical and the only variations are the stochastic fluctuations inherent in the semiconductor process.

Referring again to FIG. 2, the select inputs of each of the multiplexers 60 of FIG. 3 in each of the sub-delay lines are fed by the outputs of up/down counters 62a through 62p. In the case of sub-delay lines with multiplexers having sixteen data inputs, 4-bit counters are employed as counters 62a through 62p. Counters 62a through 62p are driven by count sequence control circuit 64. If the sub-delay line not is being used, the counter value is 0. Count sequence control circuit 64 receives the PLL output and the N<3:0> term as an input.

Count sequence control circuit 64 receives control information from DLL control and start-up circuit 66. DLL control and start-up logic 66 receives up, hold, and down signals from phase discriminator 68, having a f(ref) input driven by the PLL output and a f(fb) input driven by the output of multiplexer 52. Phase discriminator 68 determines whether the delay from the delay locked loop is too short, too long, or correct, and directs the count sequence control circuit 64 accordingly to control counters 62a through 62p to advance, retard, or maintain the phase of the f(fb) signal.

If a sub-delay line 50a through 50p is active, then its counter will have the value of the number of quanta selected for that sub-delay line. The counters 62a through 62p increment and decrement in a repetitive sequence determined by the DLL control and start-up logic 66 such that there are never more than two different codes at any one time amongst the active counters. Put another way, the difference between any two counter values will never be more than one. Given the digital nature of the DLL, this assures the greatest equality possible with regards to dividing amongst the sub-delay lines 50a through 50p the total number of quanta required to maintain lock to produce the various phases of the reference clock.

The exact sequence by which the counters 62a through 62p increment (or decrement) in is a matter of design choice. One possible criteria is to calculate for each value of N the "best fit" relative to the ideal phase relationships for all N of the outputs of the active sub-delay lines and sequence the counters accordingly. This criteria is probably best for when the DLL is used separately to generate clock phases. Other sequences may be simpler to implement and adequate for other applications.

As may be seen from an examination of FIG. 2, masking logic 40 of FIG. 1 includes a masking control circuit 70 and AND gates 72a through 72p. AND gates 72a through 72p are each sets of four two-input AND gates, one input of each AND gate in the set receiving one of the 4-bit values from the corresponding one of the counters 62a through 62p coupled to the sub-delay unit 50a through 50p fed through on lines 74a through 74p. The other input to each AND gate in the set is coupled to the corresponding mask bit from masking control circuit 70 as determined by the select signals shown as M<3: 0> in the figure. The select signals M<3:0> determine the number of sub-delay lines to be included in the PLL input delay line. In general, the equation $T_{per}*(M/N)$ means $T_{per}*$(M<i:0>/N<j:0>) where M<i:0> and N<j:0> are select signals that can come from either programming bits or the user's design. In the illustrative example, i=j=3 though persons of ordinary skill in the art will realize that other values for i and j are possible as a matter of design choice.

Figure 4:
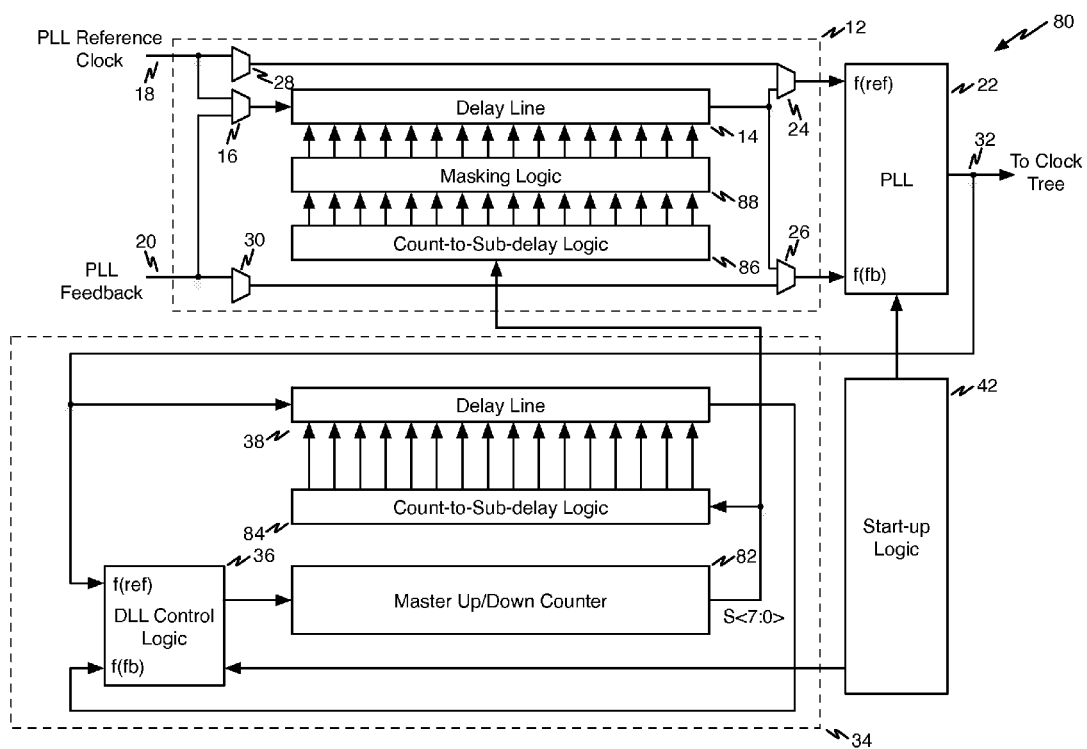
FIG. 4 is a block diagram of another illustrative compensated delay line according to the present invention.

Referring now to FIG. 4, a block diagram shows another illustrative delay line 80 compensated for process, voltage, and temperature according to the present invention. Because many of the circuit elements in the embodiment of FIG. 4 correspond to like elements in the delay line of FIG. 1, elements in the embodiment of FIG. 4 that correspond to like elements of FIG. 1 will be designated using the same reference numerals used in FIG. 1.

As in the delay line of FIG. 1, PVT-compensated delay line 80 of FIG. 4 includes a delay line 14. The input to delay line 14 is driven by multiplexer 16 that selectively provides the PLL reference clock on line 18 or the PLL feedback on line 20 to the delay line input.

The output of delay line 14 is provided to phase-locked loop (PLL) 22 through multiplexers 24 and 26. Multiplexer 24 selectively provides either the output of delay line 14 or the PLL reference clock signal from line 18 to the f(ref) input of PLL 22. Multiplexer 26 selectively provides either the output of delay line 14 or the PLL feedback signal from line 20 to the f(fb) input of PLL 22. Multiplexers 28 and 30 that provide the PLL reference clock signal and PLL feedback signal to multiplexers 24 and 26 are shown having only one input and are present to provide path delays that match the delay of the PVT delay line multiplexer 16. The output of PLL 22 drives the clock tree of the integrated circuit from line 32. The feedback line 20 is sampled from a convenient branch of the clock tree or in some applications driven from line 32 by means of multiplexers not shown.

Delay line 80 also includes delay locked loop 34. DLL 34 includes DLL control logic 36 and delay line 38. Unlike the embodiment of FIG. 1, delay line 80 of FIG. 4 employs master up/down counter 82 driving count-to-sub-delay logic 84, which is a decoder. Master up/down counter 82 takes the place of the individual counters 62a through 62p and outputs an eight-bit binary count. Count-to-sub-delay logic 84 decodes that eight-bit binary count into sixteen 4-bit binary numbers to drive the sub-delay units 50a through 50p in delay line 38.

The embodiment of FIG. 4 is particularly useful when the delay lines 34 and 14 are separated by some distance on the integrated circuit in that only eight metal lines are needed (to carry Q<7:0>) rather than the sixty-four metal lines necessary in the embodiment of FIG. 1 to transfer the sub-delay information to the delay line 14 in PVT-compensated delay line 12. A count-to-sub-delay logic 86 identical to count-to-sub-delay logic 84 is present in PVT-compensated delay line 12 and decodes the eight-bit binary number out of the master up/down counter 82 to provide the sixteen 4-bit binary numbers to drive the sub-delay units 50a through 50p in delay line 14. Masking logic 88 is interposed between count-to-sub-delay logic 86 and delay line 14. Masking logic 88 may have the same structure as the masking logic shown in FIG. 2.

Figure 5:
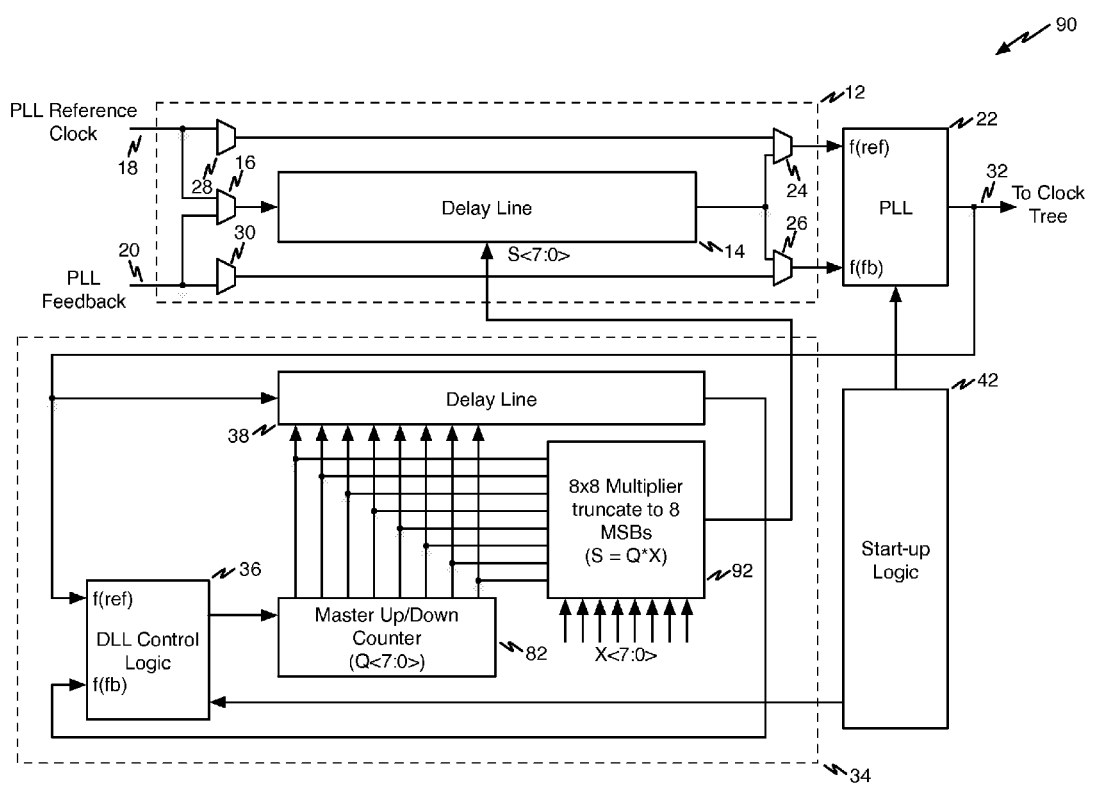
FIG. 5 is a block diagram of another illustrative compensated delay line according to the present invention.

Referring now to FIG. 5, a block diagram shows another illustrative delay line 90 compensated for process, voltage, and temperature according to the present invention. Because many of the circuit elements in the embodiment of FIG. 5 correspond to like elements in the delay lines of previous figures, elements in the embodiment of FIG. 5 that correspond to like elements of previous figures will be designated using the same reference numerals used in those figures.

As in the delay line of FIGS. 1 and 4, PVT-compensated delay line 90 of FIG. 5 includes a delay line 14. The input to delay line 14 is driven by multiplexer 16 that selectively provides the PLL reference clock on line 18 or the PLL feedback on line 20 to the delay line input.

The output of delay line 14 is provided to phase-locked loop (PLL) 22 through multiplexers 24 and 26. Multiplexer 24 selectively provides either the output of delay line 14 or the PLL reference clock signal from line 18 to the f(ref) input of PLL 22. Multiplexer 26 selectively provides either the output of delay line 14 or the PLL feedback signal from line 20 to the f(fb) input of PLL 22. Multiplexers 28 and 30 that provide the PLL reference clock signal and PLL feedback signal to multiplexers 24 and 26 are shown having only one input and are present to provide path delays that match the delay of the PVT delay line multiplexer 16. The output of PLL 22 drives the clock tree of the integrated circuit from line 32. The feedback line 20 is sampled from a convenient branch of the clock tree or in some applications driven from line 32 by means of multiplexers not shown.

The embodiment shown in FIG. 5 also employs fewer interconnects between the DLL 34 and the PVT-compensated delay line 12 than the embodiment in FIG. 1. In the embodiment of FIG. 5, the output of master up/down counter 82 (labeled Q<7:0> in FIG. 5) is presented to multiplier 92, where it is multiplied by the term X<7:0>. The 16-bit product Y (Y<15:0>=Q<7:0>*X<7:0>) is truncated to eight MSBs which are presented to delay line 14. Optionally, the product Y may be rounded instead of being truncated as a matter of design choice if the added precision is desired in a specific design. The use of multiplier 92 performs the arithmetic function that was performed by masking logic 88 and the Count-to-Sub-delay Logic 84 of the embodiment of FIG. 4. In this embodiment, $X*T_{per}$ is the digital fraction of the clock period desired in the PVT delay line. X is an 8-bit binary fraction (meaning the radix is to the left of the most significant bit making X {0/256, 1/256, 2/256, . . . , 254/256, 255/256}) that replaces the fraction M/N of the embodiment shown in FIG. 1. The truncation/rounding of the 16-bit integer multiplication performed by multiplier 92 places the radix at the correct location between bits Y<8> and Y<7>, thus presenting an 8-bit binary integer Y<15:8> to the PVT-compensated delay line 12. Eight bits of delay line are shown, but other design choices can be used.

Figure 6:
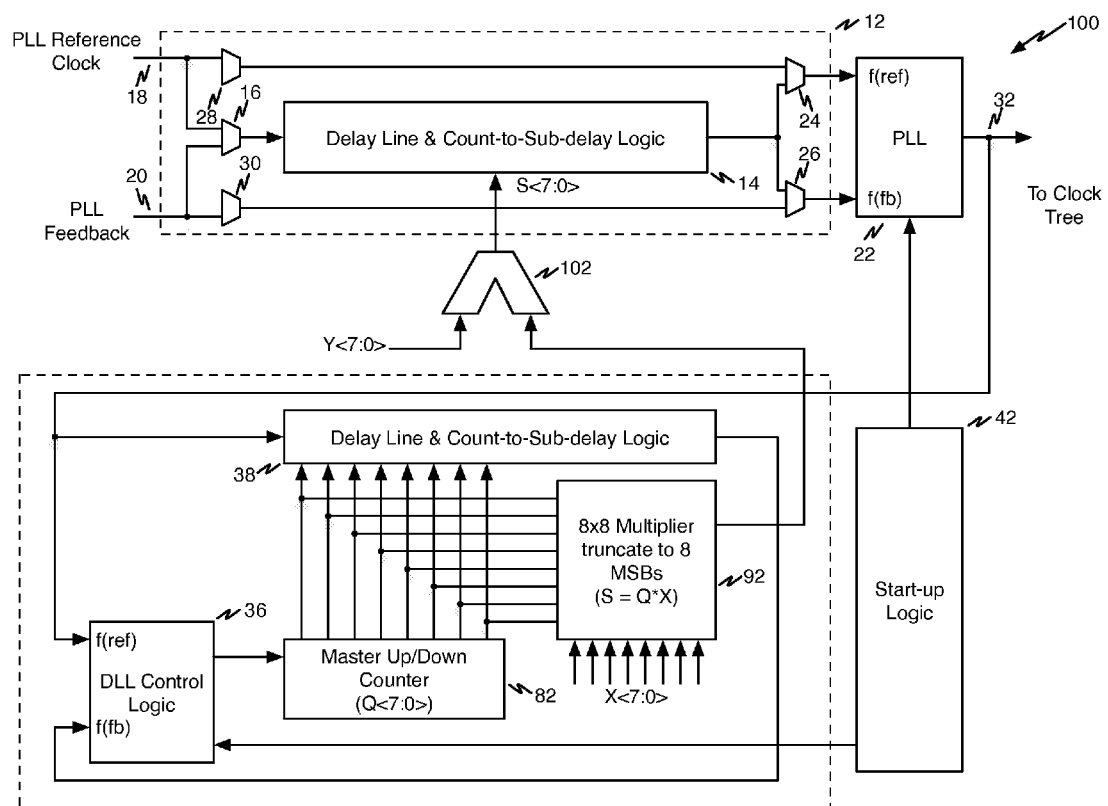
FIG. 6 is a block diagram of another illustrative compensated delay line according to the present invention.

Referring now to FIG. 6, a block diagram shows another illustrative delay line 100 compensated for process, voltage, and temperature according to the present invention. Because many of the circuit elements in the embodiment of FIG. 6 correspond to like elements in the delay lines of previous figures, elements in the embodiment of FIG. 6 that correspond to like elements of the embodiments of previous figures will be designated using the same reference numerals used in those figures.

The embodiment shown in FIG. 6 operates in the same manner as the embodiment shown in FIG. 5 except that adder 102 allows the term W<7:0> to be added to the product from multiplier 92. Here Z<7:0>=W<7:0>+Y<7:0> where W is a non-PVT compensated delay specified by the user. Persons skilled in the art will note that neither of the delay lines 14 and 38 need either count-to-sub-delay logic decoders or masking logic to decode the 8-bit count from master up/down counter and the 8-bit sum from adder 102 since multiplier 92 is handling these functions.

Figure 7:
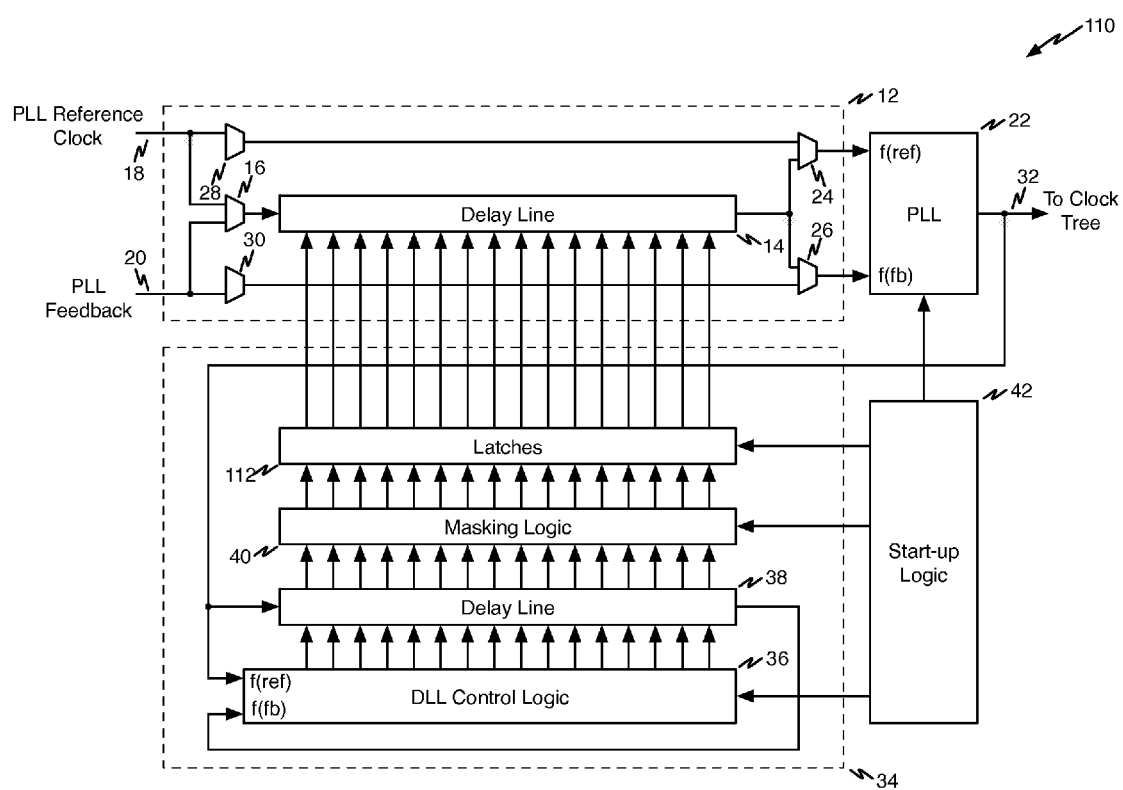
FIG. 7 is a block diagram of another illustrative compensated delay line according to the present invention.

Referring now to FIG. 7, a block diagram shows another illustrative delay line 110 compensated for process, voltage, and temperature according to the present invention. Because many of the circuit elements in the embodiment of FIG. 7 correspond to like elements in the delay line of FIG. 1, elements in the embodiment of FIG. 7 that correspond to like elements of the embodiment of FIG. 1 will be designated using the same reference numerals used in FIG. 1.

The embodiment shown in FIG. 7 operates in the same manner as the embodiment shown in FIG. 1 except that latches 112 are provided between the masking logic and the PVT delay line to allow changing the value of M or N on the fly. In this case, the Start-up Logic will need to execute an appropriate procedure to make the transition. Such a procedure might be to first latch the current PVT delay line value, then change the values of M and N. The system is then reset to allow the DLL to acquire lock, then temporarily disable DLL tracking and correction. The latches are then released (made transparent) on the PVT delay line controls either all at once or in stages as a matter of design choice. The PLL lock signal (not shown in the figure) is monitored to allow it to reacquire lock, if necessary. The DLL tracking and correction is then re-enabled and the DLL lock signal (not shown in the figure) is monitored to allow it to reacquire lock, if necessary. The system is then notified that the PLL and PVT delay line are again ready to commence operation.

Figure 8:
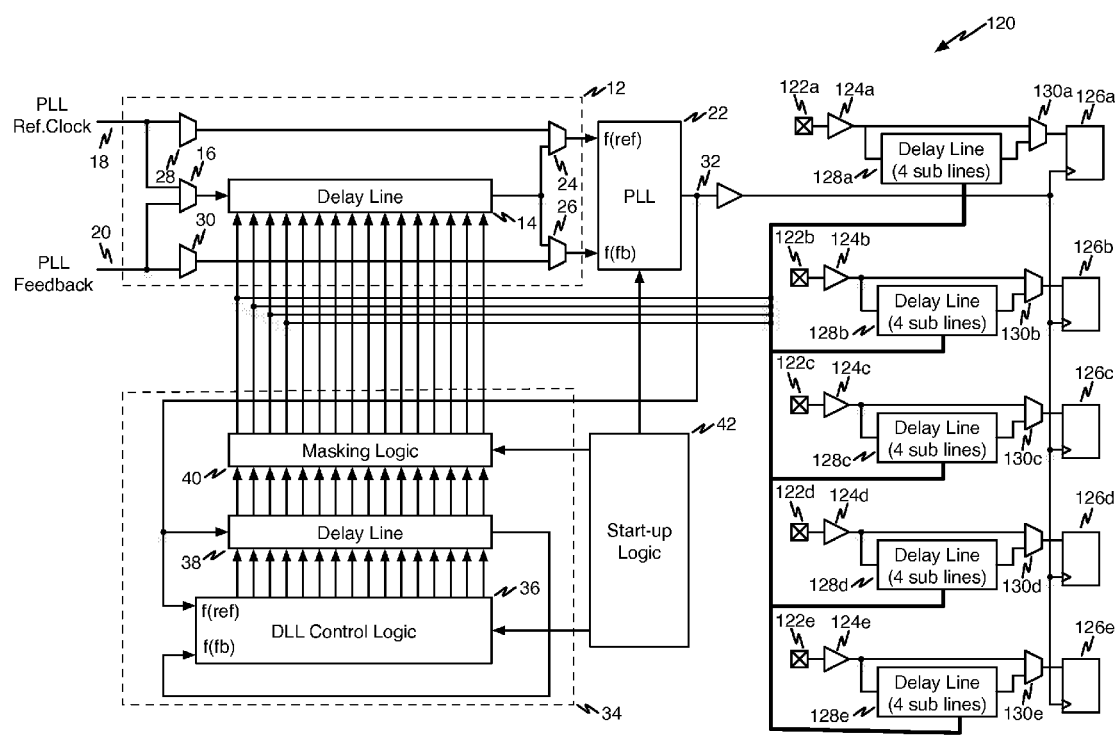
FIG. 8 is a block diagram of another illustrative compensated delay line according to the present invention.

Referring now to FIG. 8, a block diagram shows another illustrative delay line 120 compensated for process, voltage, and temperature according to the present invention. Because many of the circuit elements in the embodiment of FIG. 8 correspond to like elements in the delay line of FIG. 1, elements in the embodiment of FIG. 8 that correspond to like elements of the embodiment of FIG. 1 will be designated using the same reference numerals used in FIG. 1.

It is possible to use the DLL 34 to control more than one PVT delay element. Since the information controlling the PVT elements is digital, it can be widely distributed with relative ease. In FIG. 8, it may be seen that a number of input pads 122a through 122e each have an input buffer 124a through 124e, a flip/flop 126a through 126e, and a selectable PVT delay line 128a through 128e associated with it. The data input of each flip flop is driven by a multiplexer 130a through 130e to allow the delay lines to be selectively placed in the signal path.

In the illustrative example shown in FIG. 8, each of the delay lines associated with the input pads only has four sub-delay lines instead of the full complement of 16 in the DLL. It is assumed that this is corresponds to the maximum delay needed in anticipated applications. The delay $(M/N)*T_{per}$ (where 1<=M<=4) can be PVT regulated in the DLL and distributed to the input delay lines and used wherever needed. An arrangement like the one shown in FIG. 8 could be very useful in capturing a source synchronous data burst (in an application like DDR or DDR2 for SDRAMs).

The following embodiments separate the DLL and PLL feedback loops in order to avoid PLL-DLL loop interactions. The following embodiments create the same time shifting effect while creating a circuit that is simpler to design.

Figure 9:
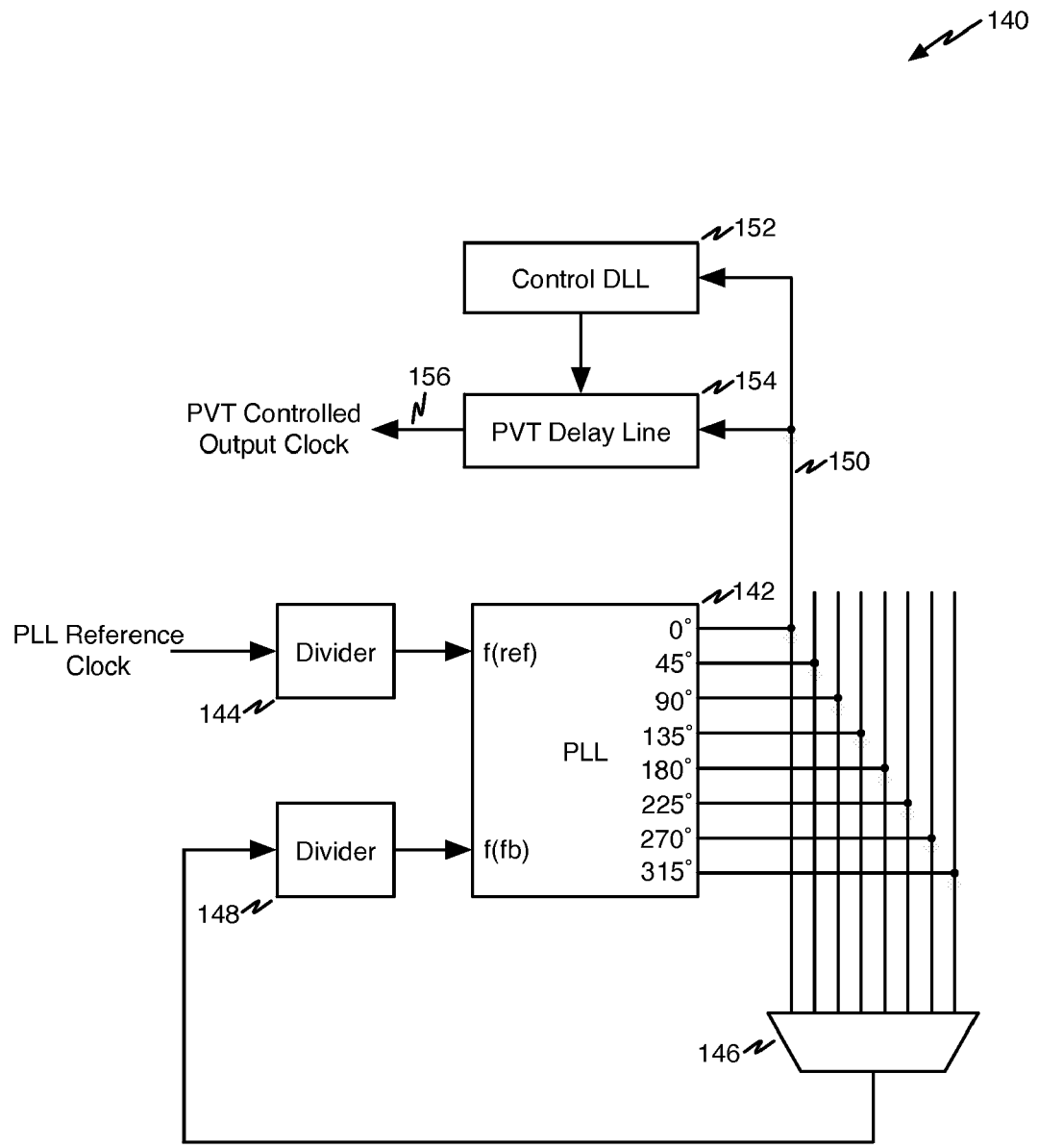
FIG. 9 is a block diagram of another illustrative compensated delay line according to the present invention.

Referring now to FIG. 9, a block diagram shows another illustrative delay line 140 compensated for process, voltage, and temperature according to the present invention. The reference input f(ref) of PLL 142 is provided with a PLL reference clock signal through divider 144. PLL 142 has outputs at 0°, 45°, 90°, 135°, 180°, 225°, 270°, and 315°. These outputs are all provided to the data inputs of multiplexer 146. The output of multiplexer 146 is fed back to the feedback input f(fb) of PLL 142 through divider 148. The use of dividers 144 and 148 in PLL circuits to multiply or divide the PLL reference clock is well known.

The 0° output of PLL 142 is provided on output line 150 to control DLL 152. Control DLL 152 is coupled to PVT delay line 154. The PVT controlled output clock is the output of PVT delay line 154 on line 156. Control DLL 152 my be any of the DLL circuits shown in the embodiments of FIGS. 1 and 4-8 or other DLL circuits, including the portions of the circuits that provide the fractional M/N delay control information. PVT delay line 154 may be any of the delay line circuits 14 disclosed in the previous embodiments herein, or other delay line circuits that perform the same function.

PLL 142 in the embodiment of FIG. 9 has eight output phases spaced 45° apart. Usually 0° phase is used to drive clock networks and feedback to the f(fb) input of the PLL. If a different phase is used for the feedback path (by selecting a different one of the data inputs of multiplexer 146), all of the phases are time shifted backwards by the number of degrees of the phase being used. For example: if the 45° phase is used for feedback, it becomes the de facto 0° phase. This means that the 90° phase becomes the de facto 45° phase, the 135° phase becomes the de facto 90° phase, and so forth. Most importantly, the original 0° phase becomes the 315° phase=−45° (or minus or negative 45°) phase. Thus PVT compensated time can be subtracted from the input to the PVT delay line which by itself can only add PVT compensated delay. The ability to add and subtract is a convenient feature of the present invention.

The embodiment depicted in FIG. 9 uses the arbitrary nature of the PLL output phases to subtract PVT compensated time from the total desired delay while the PVT delay line adds PVT compensated time to the total desired delay. If the shortest maximum delay (due to PVT conditions) is greater than 45° of the lowest clock frequency, then there will be no gaps greater than one quanta in the continuum of delays that can be offered from 0° to 360°. Persons of ordinary skill in the art will realize that having eight output phases from the PLL 22 is a matter of design choice and that other numbers of phases can be used.

Figure 10:
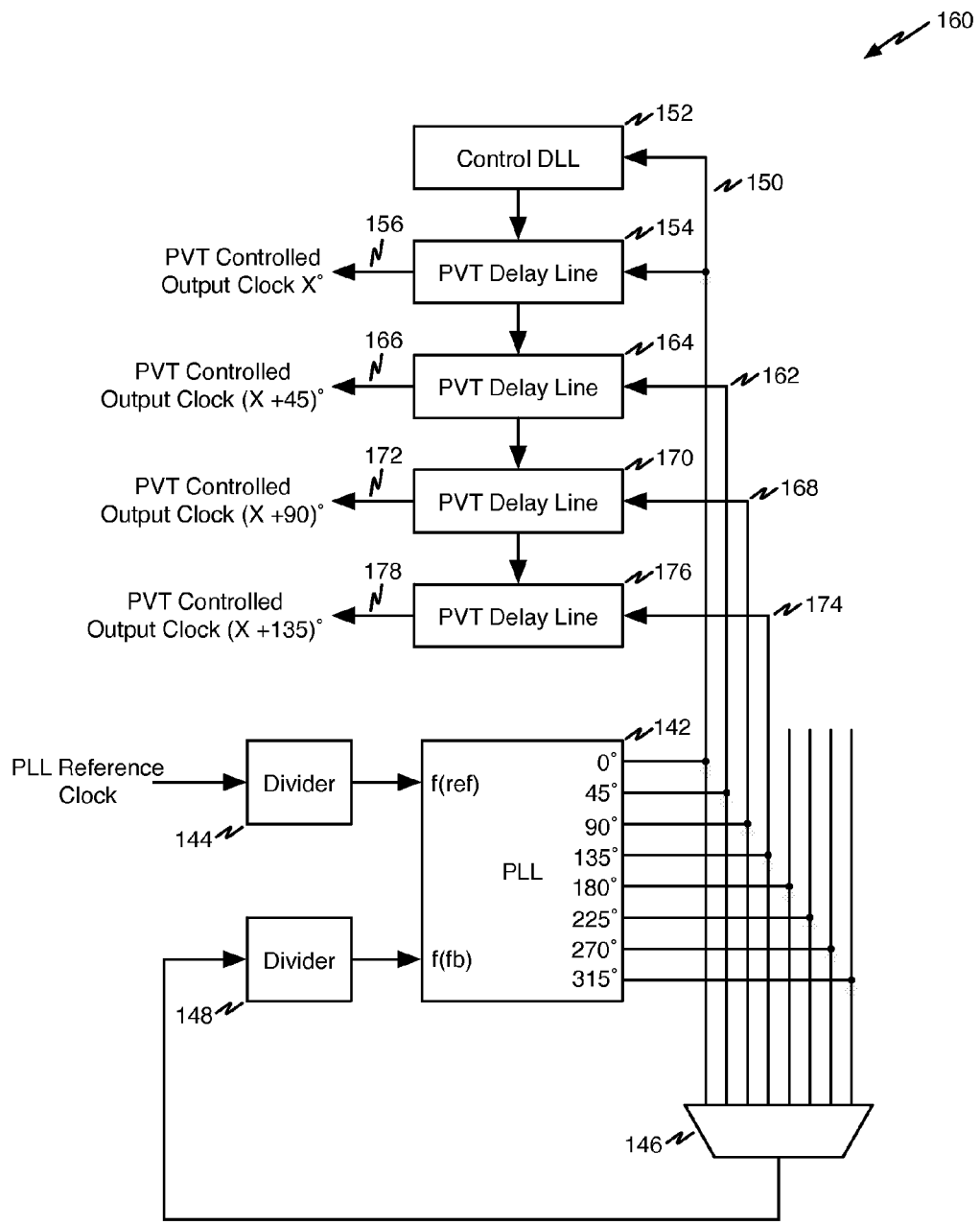
FIG. 10 is a block diagram of another illustrative compensated delay line according to the present invention.

Referring now to FIG. 10, a block diagram shows another illustrative delay line 160 compensated for process, voltage, and temperature according to the present invention. Because many of the circuit elements in the embodiment of FIG. 10 correspond to like elements in the delay line of FIG. 9, elements in the embodiment of FIG. 10 that correspond to like elements of the embodiment of FIG. 9 will be designated using the same reference numerals used in FIG. 9.

The embodiment of FIG. 10 includes all of the elements of FIG. 9 and additionally uses the 45° output phase line 162 of PLL 142 to drive PVT delay line 164 to produce the PVT controlled output clock at a phase of X+45° on line 166. Similarly, the embodiment of FIG. 10 uses the 90° output phase line 168 of PLL 142 to drive PVT delay line 170 to produce the PVT controlled output clock at a phase of X+90° on line 172, and the 135° output phase line 174 of PLL 142 to drive PVT delay line 176 to produce the PVT controlled output clock at a phase of X+135° on line 178. Only four phases need to be brought out because inverting a phase (by, for example, employing a negative edge triggered flip/flop instead of a positive edge triggered one) adds +180° to the phase. The PVT delay lines 164, 170, and 176 are controlled by control DLL 152.

The embodiment of FIG. 9 cannot shift more than one phase because one PVT delay line can only be connected to one phase at a time. By adding three more PVT delay lines as shown in FIG. 10, this can be remedied by giving phases 0°, 45°, 90°, and 135° each their own delay line and picking up phases 180°, 225°, 270°, and 315° using inversion at the destination. This produces the effect of having the PVT delay line placed directly in series with either f(ref) or f(fb) as it is in the embodiments depicted in FIGS. 1, and 4-8. Additional functionality can be accomplished by allowing a different control code to be provided from the DLL to each individual PVT delay line.

Figure 11:
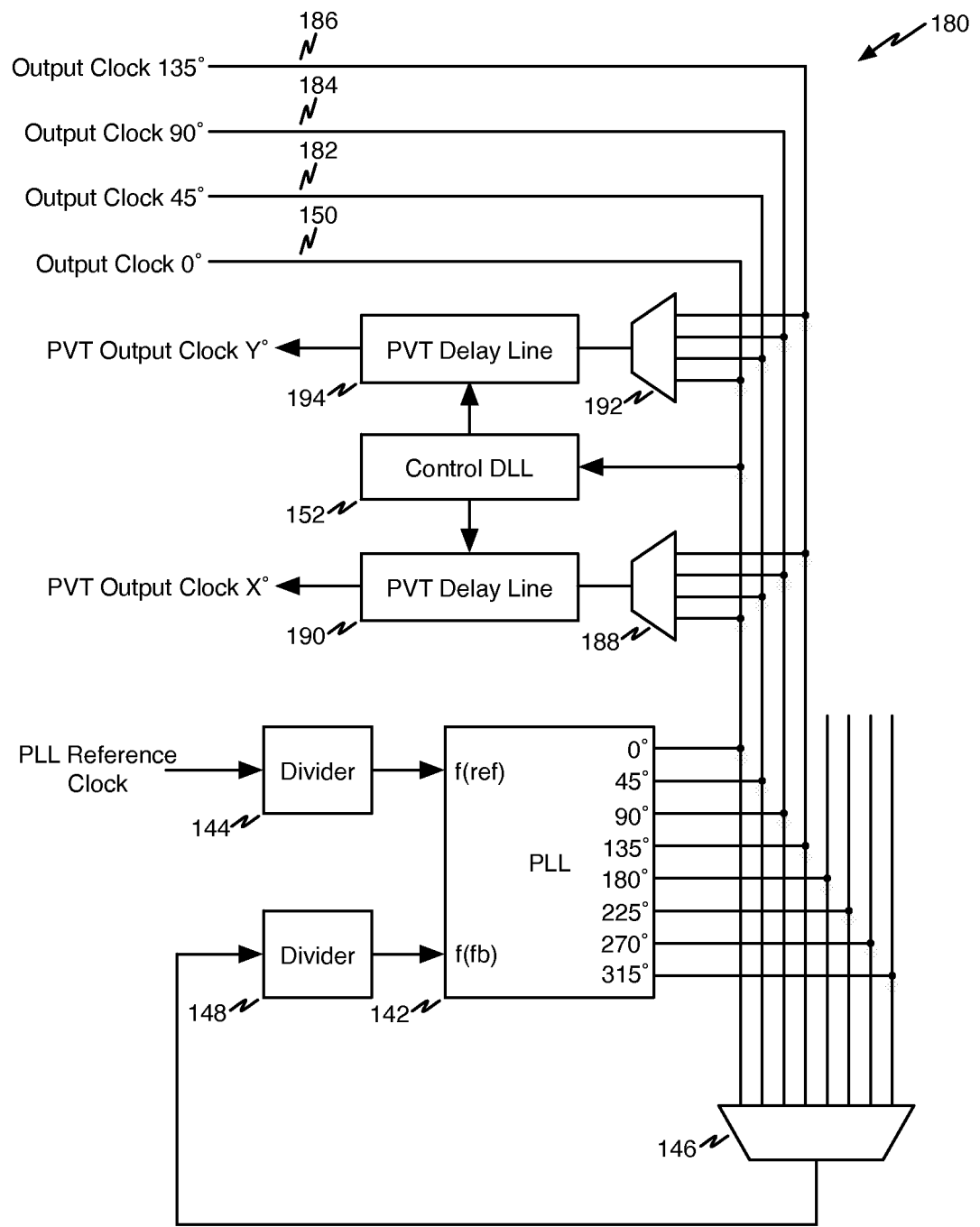
FIG. 11 is a block diagram of another illustrative compensated delay line according to the present invention.

Referring now to FIG. 11, a block diagram shows another illustrative delay line 180 compensated for process, voltage, and temperature according to the present invention. Because many of the circuit elements in the embodiment of FIG. 11 correspond to like elements in the delay line of FIG. 10, elements in the embodiment of FIG. 11 that correspond to like elements of the embodiment of FIG. 10 will be designated using the same reference numerals used in FIG. 10.

In addition to the features that were disclosed with reference to the embodiment of FIG. 10, the embodiment of FIG. 11 includes the use of the 0°, 45°, 90°, and 135° phase output lines from PLL 142. Multiplexer 188 provides a selected one of the 0°, 45°, 90°, and 135° phase output lines from PLL 142 to a second PVT delay line 190. Similarly, multiplexer 192 provides a selected one of the 0°, 45°, 90°, and 135° phase output lines from PLL 142 to a third PVT delay line 194. Both PVT delay lines 190 and 194 are controlled by control DLL 152 in the manner disclosed herein, including the portions of the circuits that provide the fractional M/N delay control information to the delay lines. PVT delay lines 190 and 194 may also be any of the delay line circuits 14 disclosed in the previous embodiments herein, or other delay line circuits that perform the same function.

Since very few applications use more than two clock phases, die area can potentially be saved by only having two PVT compensated delay lines. The tradeoff is that this circuit does not allow full PLL functionality with the PVT delay.

Figure 12:
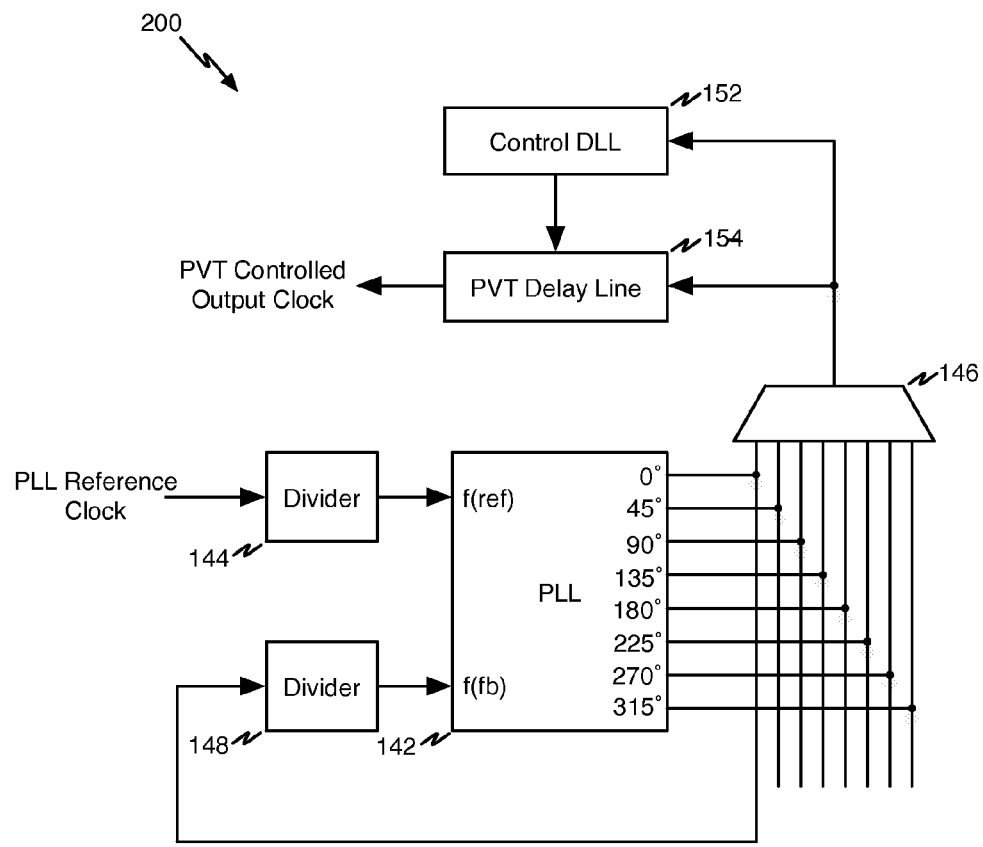
FIG. 12 is a block diagram of another illustrative compensated delay line according to the present invention.

Referring now to FIG. 12, a block diagram shows another illustrative delay line 200 compensated for process, voltage, and temperature according to the present invention. Because many of the circuit elements in the embodiment of FIG. 12 correspond to like elements in the delay line of FIG. 9, elements in the embodiment of FIG. 12 that correspond to like elements of the embodiment of FIG. 9 will be designated using the same reference numerals used in FIG. 9.

The functionality of the embodiment depicted in FIG. 12 is identical to that of the embodiment depicted in FIG. 9, with the exception that phase 0° is always the feedback source, since the feedback loop of the PLL 142 through divider 148 is hardwired to the 0° phase output of PLL 142. PVT compensated time subtraction is performed by using multiplexer 146 to select an earlier phase to send to the PVT delay line 154 rather than changing the PLL phases and always sending phase 0° to the PVT delay line as in the embodiment shown in FIG. 9. The PVT delay line 154 controlled by control DLL 152 adds PVT compensated delay to the output of the PLL having the phase chosen by the multiplexer.

Persons of ordinary skill in the art will appreciate that the present invention is particularly well suited for application in an FPGA integrated circuit but that the inventive concept disclosed herein has far broader application. Such skilled persons will also appreciate that the usual FPGA-related components that would be present in an implementation of the present invention in an FPGA integrated circuit such as other multiplexers, control elements, programmable logic blocks, programmable connection elements have been omitted in the previous figures for simplification. Similarly, again for simplicity, the PLL circuits are shown in most of the drawing figures generically with no dividers on the inputs and outputs.

Figure 13:
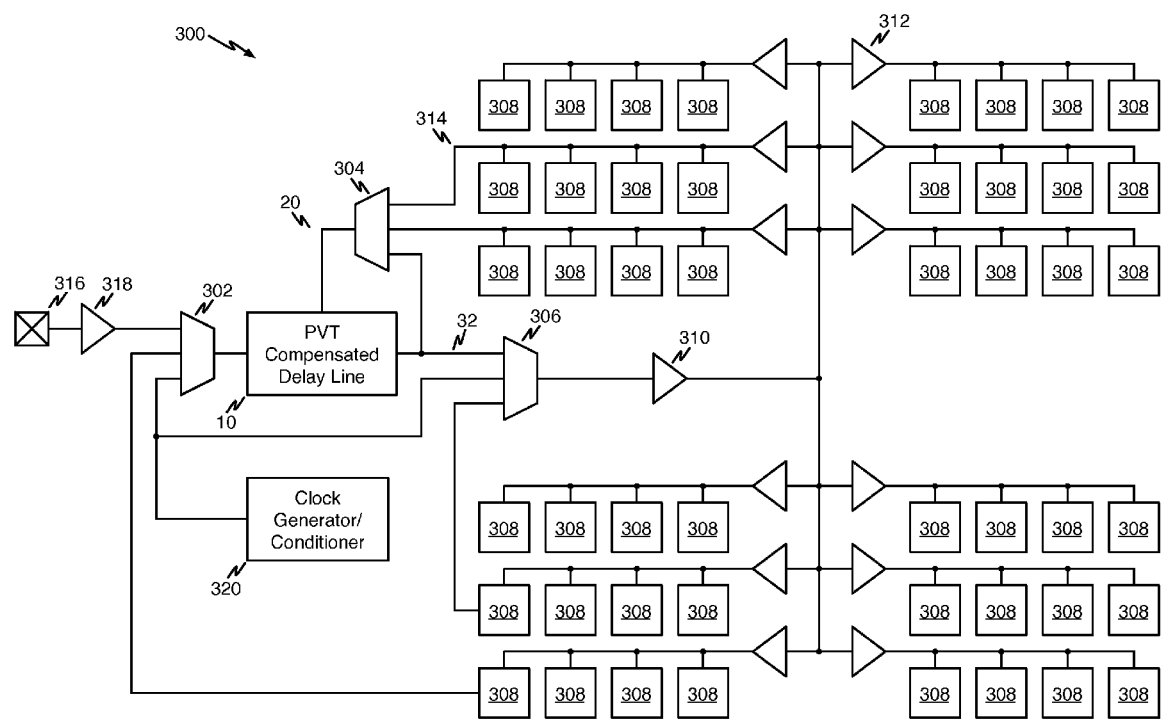
FIG. 13 is a block diagram of a portion of an FPGA integrated circuit including an illustrative compensated delay line according to the present invention.

Referring now to FIG. 13, a block diagram shows an exemplary FPGA 300 with the embodiment of FIG. 1 in context with some (but not all) of the FPGA components. FPGA 300 includes PVT compensated delay line 10 with its PLL reference clock line 18, PLL feedback line 20, and PLL output line 32 coupled to the output of multiplexer 302, the output of multiplexer 304, and one input of multiplexer 306 respectively. Also shown in FIG. 13 is an array of logic modules 308. Logic modules 308 can contain, for example, logic function generators, registers, latches and other combinational and sequential functions as a matter of design choice and different logic modules may contain different circuits.

A routing architecture (not shown) for interconnection the logic modules 308 to each other and to user I/O pads (not shown) will also be present. Many suitable logic modules and routing architectures are known in the art and the choice of an appropriate combination of logic module structure and routing architecture is beyond the scope of this disclosure. The exemplary FPGA 300 also has a clock tree shown comprising first stage buffer 310 the output of which drives a plurality of second-stage buffers (an exemplary one of which is labeled 312), each of which drives a clock distribution line (an exemplary one of which is labeled 314). Each clock distribution line 314 distributes the signal on the clock tree to a subset of the array of logic modules 308. Persons skilled in the art will realize that multiple clock trees are usually present in a commercial FPGA.

Multiplexer 302 is shown providing a signal to the PLL reference clock line 18 from clock input pad 316 by means of clock input buffer 18, from a logic module 308 in the array of logic modules, and from clock generator circuit 320. Clock generator 320 could be another instance PVT compensated delay line 10, since with the addition of some multiplexers (not shown in previous figures) both the PLL and DLL inside PVT compensated delay line 10 can be used for general clock applications if the programmable delay line is not needed.

Multiplexer 304 is shown providing a signal to the PLL feedback clock line 20 from two different clock distribution lines 314 and the PLL output line 32. This latter connection would allow the PLL inside PVT compensated delay line 10 to receive its own output as its feedback input as in the embodiment of FIG. 12. Multiplexer 306 is shown providing a signal to the clock tree from PLL output line 32, clock generator circuit 320 and a logic module 308 in the array of logic modules.

A commercial FPGA includes many more programmable options than are shown in FIG. 13. A non-exhaustive list of examples of options that would usually be present includes more external clock input pads 316 and input buffers 318, sourcing from more clock distribution lines 314, multiple PVT compensated delay lines 10, multiple clock generators 320, and sourcing from more locations in the array of logic modules 308. Design software provided by the manufacturer would be used to make all of the available options available to the end user.

It will also be appreciated by persons of ordinary skill in the art that the reason for taking the output of the PLL as the reference input to the DLL assumes that some clock multiplication or division has taken place and that the input reference to the PLL is not the correct frequency to input to the DLL. Such skilled persons will appreciate that, in an application where there is no clock multiplication, it may be preferable to use the same reference clock for both the PLL and the DLL to simplify the design and eliminate the need for the start-up logic and sequencing described. It is also possible the start-up logic is unnecessary in any particular case, but that would depend on the specifics of the individual situation and would be a design choice.

Many permutations of the embodiments shown in and described with respect to the previous figures are possible. For example, the AND-gates of the masking logic could be replaced by latches with resets. Then M would be determined by the number of count groups which pass the data, while the unused ones would be left with the reset value of zero. This could be merged with the change on the fly feature of the 3rd embodiment.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable clock delay line compensated for process, voltage, and temperature in an integrated circuit, comprising:
    a delay-locked loop having a reference input, a feedback input, and a clock output, and a control output wherein the delay-locked loop feedback input is coupled to the delay-locked loop output;
    a phase-locked loop having a reference input, a feedback input, and an output, wherein the phase-locked loop output is coupled to the delay-locked loop reference input and the phase-locked loop feedback input;
    a reference clock coupled to the phase-locked loop reference input;
    first and second sources of programming data; and
    a signal delay line with a control input coupled to the delay-locked loop control output, wherein:
    the signal delay line either is coupled between the reference clock and the phase-locked loop reference input or is coupled between the phase-locked loop output and the phase-locked loop feedback input according to the first source of programming data and
    the delay of the signal delay line is determined according to the second source of programming data.

2. The programmable clock delay line of claim 1, further comprising:
    a clock tree coupled between the phase-locked loop output and the phase-locked loop feedback input;
    a divider coupled between the reference clock and the phase-locked loop reference input; and
    a divider coupled between the clock tree and the phase-locked loop input.

3. The programmable clock delay line of claim 2, further comprising:
    a third source of programming data; and
    a multiplexer coupled between the phase-locked loop output and the delay-locked loop input and coupled to the reference clock, wherein:
    the multiplexer presents either the output of the phase-locked loop or the reference clock to the reference input of the delay-locked loop according to the third source of programming data.

4. The programmable clock delay line of claim 1, further comprising:
    a third source of programming data; and
    a multiplexer coupled between the phase-locked loop output and the delay-locked loop input and coupled to the reference clock, wherein:
    the multiplexer presents either the output of the phase-locked loop or the reference clock to the reference input of the delay-locked loop according to the third source of programming data.

5. A programmable clock delay line compensated for process, voltage, and temperature in an integrated circuit, comprising:
    a clock output;
    a first source of programming data;
    a phase-locked loop having a reference input, a feedback input, and a plurality of phase outputs, wherein one of the phase outputs is coupled to the phase-locked loop feedback input;
    a reference clock coupled to the phase-locked loop reference input;
    a delay-locked loop having a reference input, a feedback input, a clock output, and a control output, wherein: the delay-locked loop feedback input is coupled to the clock output, and one of the phase-locked loop phase outputs is coupled to the delay-locked loop reference input;
    a signal delay line with a control input, a signal input, and a signal output, wherein the control input is coupled to the delay-locked loop control output, the signal input is coupled to one of the phase-locked loop phase outputs, and the signal output is coupled to the clock output, wherein:
    the delay of the signal delay line is determined according to the first source of programming data.

6. The programmable clock delay line of claim 5, further comprising:
    a second source of programming data; and
    a multiplexer coupled between at least two of the phase-locked loop phase outputs and the delay-locked loop reference input, wherein:
    the phase-locked loop phase output coupled to the delay-locked loop reference input is determined according to the second source of programming data.

7. The programmable clock delay line of claim 6 further comprising:
    a first divider coupled between the reference clock and the phase-locked loop reference input.

8. The programmable clock delay line of claim 7 further comprising:
    a second divider coupled between the phase-locked loop phase output and the phase-locked loop feedback input.

9. The programmable clock delay line of claim 5 further comprising:
    a first divider coupled between the phase-locked loop phase output and the phase-locked loop feedback input.

10. The programmable clock delay line of claim 5, further comprising:
    a second source of programming data; and
    a multiplexer coupled between at least two of the phase-locked loop phase outputs and the phase-locked loop feedback input, wherein:
    the phase-locked loop phase output coupled to the phase-locked loop feedback input is determined according to the second source of programming data.

11. The programmable clock delay line of claim 10, further comprising:
    a first divider coupled between the reference clock and the phase-locked loop reference input.

12. The programmable clock delay line of claim 11, further comprising:
    a second divider coupled between the phase-locked loop phase output and the phase-locked loop feedback input.

13. The programmable clock delay line of claim 10, further comprising:
    a first divider coupled between the phase-locked loop phase output and the phase-locked loop feedback input.

* * * * *